United States Patent [19]
Vorenkamp et al.

[11] Patent Number: 5,463,308
[45] Date of Patent: Oct. 31, 1995

[54] VOLTAGE-CURRENT CONVERTER

[75] Inventors: Pieter Vorenkamp; Johannes P. M. Verdaasdonk, both of Eindhoven, Netherlands

[73] Assignee: U.S. Philips Corporation, New York, N.Y.

[21] Appl. No.: 283,236

[22] Filed: Jul. 29, 1994

[30] Foreign Application Priority Data

Jul. 30, 1993 [BE] Belgium ................... 9300814

[51] Int. Cl.$^6$ ..................... G05F 3/26
[52] U.S. Cl. ............ 323/312; 327/562; 323/315
[58] Field of Search ................... 323/312, 313, 323/315, 316; 327/551–553, 561–562

[56] References Cited

U.S. PATENT DOCUMENTS

| 4,456,887 | 6/1984 | Tokumo | 330/261 |
|---|---|---|---|
| 5,101,126 | 3/1992 | Butler et al. | 307/493 |
| 5,184,086 | 2/1993 | Inohana | 330/252 |
| 5,241,227 | 8/1993 | Jung et al. | 307/520 |
| 5,394,080 | 2/1995 | Rijns | 323/315 |
| 5,404,097 | 4/1995 | Barou | 323/312 |

FOREIGN PATENT DOCUMENTS

| 0481631 | 4/1992 | European Pat. Off. . |
|---|---|---|
| 2677822 | 12/1992 | France . |

OTHER PUBLICATIONS

R. Caprio, "Precision Differential Voltage–Current Convertor", Electronics Letters, vol. 9, No. 6, 22 Mar. 1973, pp. 147–148.

Primary Examiner—Peter S. Wong
Assistant Examiner—Aditya Krishnan
Attorney, Agent, or Firm—Edward Blocker

[57] ABSTRACT

A differential voltage-current converter has two input transistors and two cross-coupled transistors arranged in a translinear loop, the difference voltage across the emitter resistors of the cross-coupled transistors being equal to the difference voltage across the input terminals. The difference current through the cross-coupled transistors is replicated in the output transistors, thereby enabling a larger output signal amplitude to be obtained. In order to increase the permissible input voltage the bases of the cross-coupled transistors are coupled to the input transistors via emitter-followers. By connecting the collectors of the emitter-followers to the collectors of the output transistors a compensation is obtained for the decreasing current gain at high frequencies.

1 Claim, 4 Drawing Sheets

VOLTAGE-CURRENT CONVERTER

The invention relates to a voltage-current converter for converting an input voltage into an output current, comprising:

a first and a second input terminal for receiving the input voltage; a first and a second output terminal for supplying the output current; a first, a second, a third and a fourth transistor, each having a control electrode, a first main electrode and a second main electrode, the control electrode of the first transistor being coupled to the first input terminal, the control electrode of the second transistor being coupled to the second input terminal, the first main electrode of the first transistor being coupled to the second main electrode of the third transistor, the first main electrode of the second transistor being coupled to the second main electrode of the fourth transistor, the control electrode of the third transistor being coupled to the first main electrode of the second transistor, and the control electrode of the fourth transistor being coupled to the first main electrode of the first transistor;

a first resistor connected between the first main electrode of the third transistor and the first main electrode of the fourth transistor; and at least one first current source coupled to the first main electrodes of the third transistor and the fourth transistor, a fifth and a sixth transistor, each having a control electrode, a first main electrode and a second main electrode, the control electrode of the fifth transistor being coupled to the first main electrode of the first transistor, the control electrode of the sixth transistor being coupled to the first main electrode of the second transistor, the second main electrode of the fifth transistor being coupled to the first output terminal, and the second main electrode of the sixth transistor being coupled to the second output terminal;

a second resistor connected between the first main electrode of the fifth transistor and the first main electrode of the sixth transistor; and at least one second current source coupled between the first main electrodes of the fifth transistor and the sixth transistor.

Such a voltage-current converter is known from U.S. Pat. No. 4,456,887. Owing to the cross-coupled third and fourth transistors in series with the first and the second transistor a replica of the input voltage is obtained across the first resistor. A difference current flowing through tile first resistor is available on the second main electrodes of the first and the second transistor. The difference current depends on the input voltage with a high degree of linearity. Since the third and the fourth transistor have been arranged ill series with the first and the second transistor, respectively, the signal swing at the second main electrodes of the first and the second transistor is limited. This limitation is diminished by means of the fifth and the sixth transistor and the second resistor.

The voltage difference across the second resistor is a replica of the voltage difference across the first resistor. Therefore, the difference current through the fifth and the sixth transistor is equal to and just as linear as the difference current through the first and the second transistor. However, no other transistors are disposed in series with the fifth and the sixth transistor so that the signal swing on the second main electrodes of the fifth and the sixth transistor is larger than on the second main electrode of the first and the second transistor.

The third or the fourth transistor is driven further into conduction as the voltage difference across the first and tile second input terminals increases, which eventually disturbs the linearity of tile voltage-current conversion. At increasing frequency of the input signal the output current supplied by the second main electrodes of the fifth and the sixth transistor becomes increasingly unequal to the current through the first main electrodes of these transistors, as a result of which the linearity of the voltage-current conversion decreases.

SUMMARY OF THE INVENTION

It is an object of the invention to extend the signal swing and the high-frequency linearity of the known voltage-current converter. To this end, in accordance with the invention, a voltage-current converter of the type defined in the opening paragraph is characterised in that the voltage-current converter further comprises: a seventh and an eighth transistor, each having a control electrode, a first main electrode and a second main electrode, the control electrode of the seventh transistor being coupled to the first main electrode of tile first transistor, the control electrode of the eighth transistor being coupled to the first main electrode of the second transistor, the first main electrode of tile seventh transistor being coupled to the control electrode of the fourth transistor, and the first main electrode of tile eighth transistor being coupled to the control electrode of the third transistor, and in that the seventh transistor has its second main electrode coupled to the first output terminal and the eighth transistor has its second main electrode coupled to the second output terminal.

The seventh and the eighth transistor function as a level shifter for the signal voltages on the first main electrodes of the first and the second transistor and increase the voltage difference across the input terminals for which the third or the fourth transistor is fully conductive. Moreover, the drive signal for the fourth and the third transistor flows through the seventh and the eight transistor, respectively and a difference current, which is a replica of the difference current through the fifth and the sixth transistor, flows through the fourth and the third transistor. By coupling the second main electrode of the seventh transistor to the first output terminal and the second main electrode of the eighth transistor to the second output terminal a compensation is obtained for the missing high-frequency component in the collector currents of the fifth and the sixth transistor. Moreover, this provides compensation for the non-linear capacitive base-collector currents of the fifth and the sixth transistor.

It is to be noted that UK Patent-Application GB 2,211,044 discloses a voltage-current converter having first to fourth transistors arranged in the same way as in said U.S. Pat. No. 4,456,887, but in which the fifth and the sixth transistor and the second resistor have not been provided and in which two transistors corresponding to said seventh and said eighth transistor have been provided as a level shifter. However, these two transistors do not have their second main electrodes connected to the output terminals in order to compensate for the high-frequency component.

BRIEF DESCRIPTION OF THE DRAWING

These and other aspects of the invention will now be described elucidated with reference to the accompanying drawings, in which.

In the Figures parts having the same function or purpose bear the same references.

DESCRIPTION OF THE PREFERRED EMBODIMENTS

Figure 1:
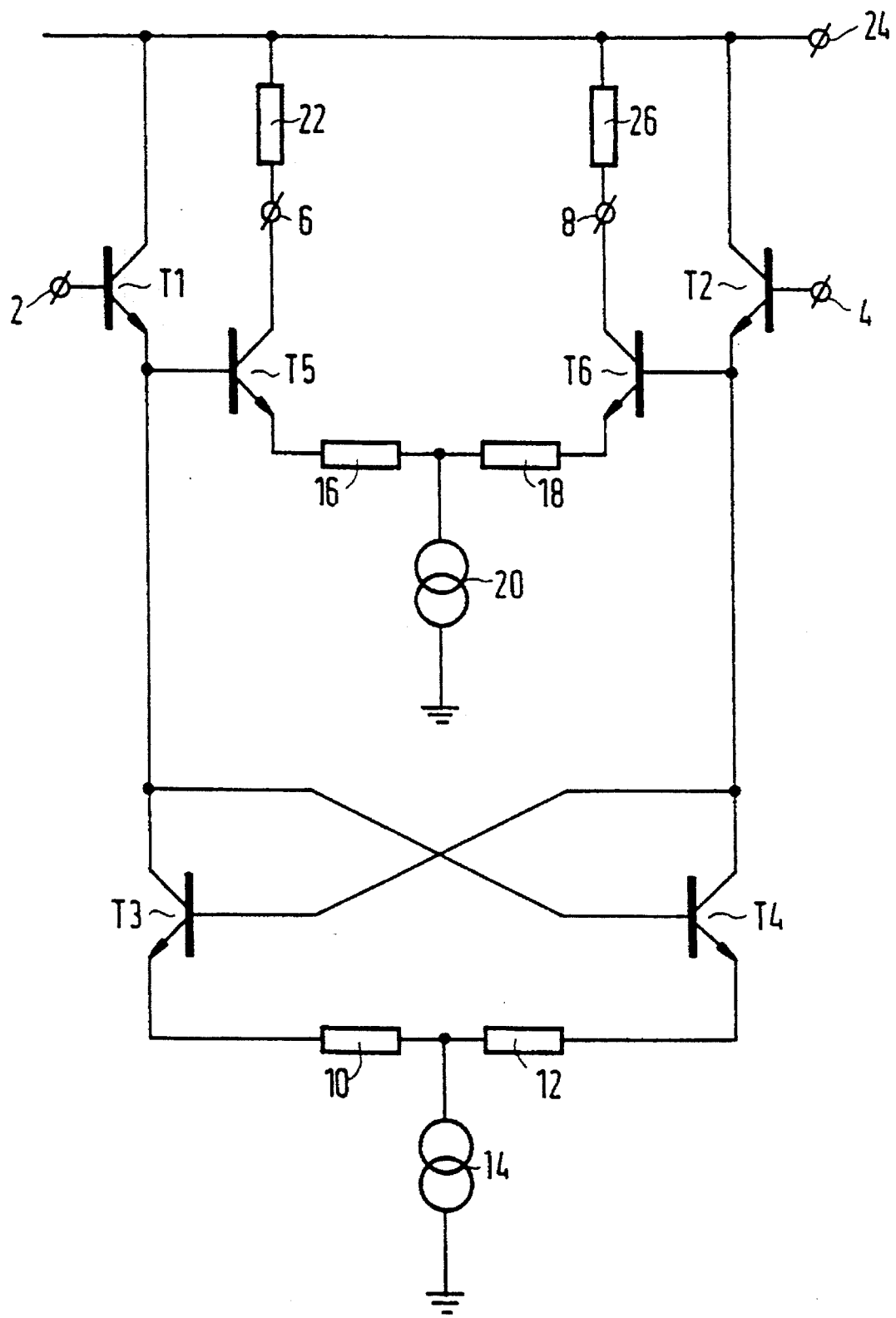
FIG. 1 shows an embodiment of a voltage-current converter in accordance with the invention comprising bipolar transistors.

FIG. 1 shows a known voltage-current converter using bipolar transistors whose control electrode, first main electrode and second main electrode correspond to the base, the emitter and the collector, respectively. The voltage-current converter converts an input voltage on a first input terminal 2 and a second input terminal 4 into an output current which is available at a first output terminal 6 and a second output terminal 8. A first transistor T1 has its base connected to the first input terminal 2 and a second transistor T2 has its base connected to the second input terminal 4. The transistor T1 has its emitter connected to the collector of a third transistor T3 and the transistor T2 has its emitter connected to the collector of a fourth transistor T4. The transistor T3 has its base coupled to the emitter of the transistor T2 and the transistor T4 has its base coupled to the emitter of the transistor T1. A first resistor formed by two identical resistors 10, 12 is connected between the emitters of the transistors T3 and T4. A first current source 14 is coupled to the emitters of the transistors T3 and T4 via the resistors 10 and 12 to supply emitter current to the transistors T3 and T4. A fifth transistor T5 has its base connected to the emitter of the transistor T1 and a sixth transistor T6 has its base connected to the emitter of the transistor T2. In the same way as with the transistors T3 and T4 a second resistor formed by two identical resistors 16, 18 is connected between the emitters of the transistors T5 and T6 and a second current source 20 is coupled to the emitters of the transistors T5 and T6 via the resistors 16 and 18 to supply emitter current to the transistors T5 and T6. The transistor T5 has its collector connected to the first output terminal 6, which is connected to, for example, a supply voltage terminal 26 via a load resistor 22. The transistor T6 has its collector connected to the second output terminal 8, which is also connected to tile supply voltage terminal 24 by a resistor 26.

The sum of the voltage V2 on the input terminal 2, the base-emitter voltage VBET1 of the transistor T1, the base-emitter voltage VBET4 of the transistor 4 and the voltage V12 across the resistor 12 is equal to the sum of the voltage V4 on the input terminal 4, the base-emitter voltage VBET2 of the transistor T2, the base-emitter voltage VBET3 of the transistor T3 and tile voltage V10 across the resistor 10:

$$V2+VBET1+VBET4+V12=V4+VBET2+VBET3+V10 \quad (1)$$

If transistors T1 and T3 are identical VBET1=VBET3 because an equal current flows through the transistors T1 and T3. The same applies to the transistors T2 and T4, so that VBET2=VBET4. Equation (1) can then be reduced to:

$$V2-V4=V10-V12 \quad (2)$$

The voltage difference across the input terminals 2, 4 then appears across the resistors 10 and 12, where it produces a difference current which is independent of the base-emitter voltages and is therefore highly linear. In the case of identical resistors 10 and 12 and identical transistors T1–T4 the current from the current source will be divided uniformly and the offset voltage between the input terminals 2 and 4 will be minimal. The difference current flows through the transistors T1 and T2, whose collectors may form the output on which the output current is available. The maximum signal voltage available on the collectors of the transistors T1 and T2 is limited by the transistors T3 and T4. However, the signal amplitude on the collectors of the transistors T5 and T6 can be larger because no further transistors have been arranged in series with these transistors. Moreover, the increased collector-base voltage of the transistors T5 and T6 has the advantage that it reduces tile collector-base capacitance of these transistors.

The transistors T5 and T4 receive a similar drive signal on their bases. The same applies to tile transistors T6 and T3. By selecting the currents from the current sources 20 and 14, the resistance values of tile resistors 10, 12, 16 and 18 and the dimensions of the transistors T3, T4, T5 and T6 to be equal it is now achieved that the difference current through the transistors T5 and T6 is equal to and has the same linearity as the difference current through the transistors T1/T3 and T2/T4. It is to be noted that the same effect can also be obtained by scaling up the dimensions of the transistors T5 and T6 and the current source 20 and scaling down the resistors 16 and 18 by the same factor.

Figure 2:
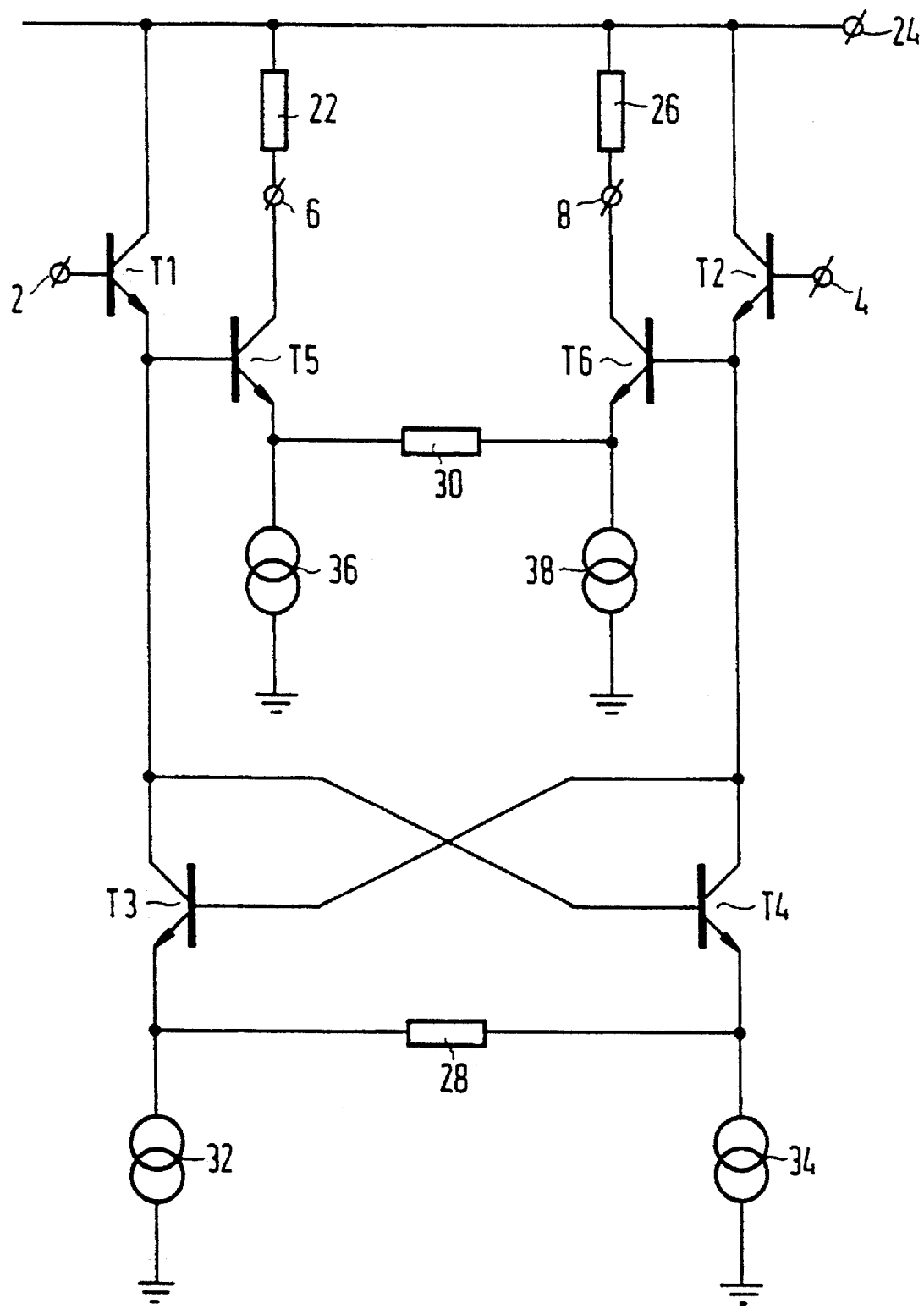
FIG. 2 shows an embodiment of a voltage-current converter in accordance with the invention comprising bipolar transistors.

FIG. 2 shows an alternative circuit arrangement in which the resistors 10 and 12 have been combined to a single resistor 28 and the resistors 16 and 18 have been combined to a single resistor 30, the emitters of the transistors T3, T4, T5 and T6 each being connected to an individual current source 32, 34, 36 and 38, respectively.

Figure 3:
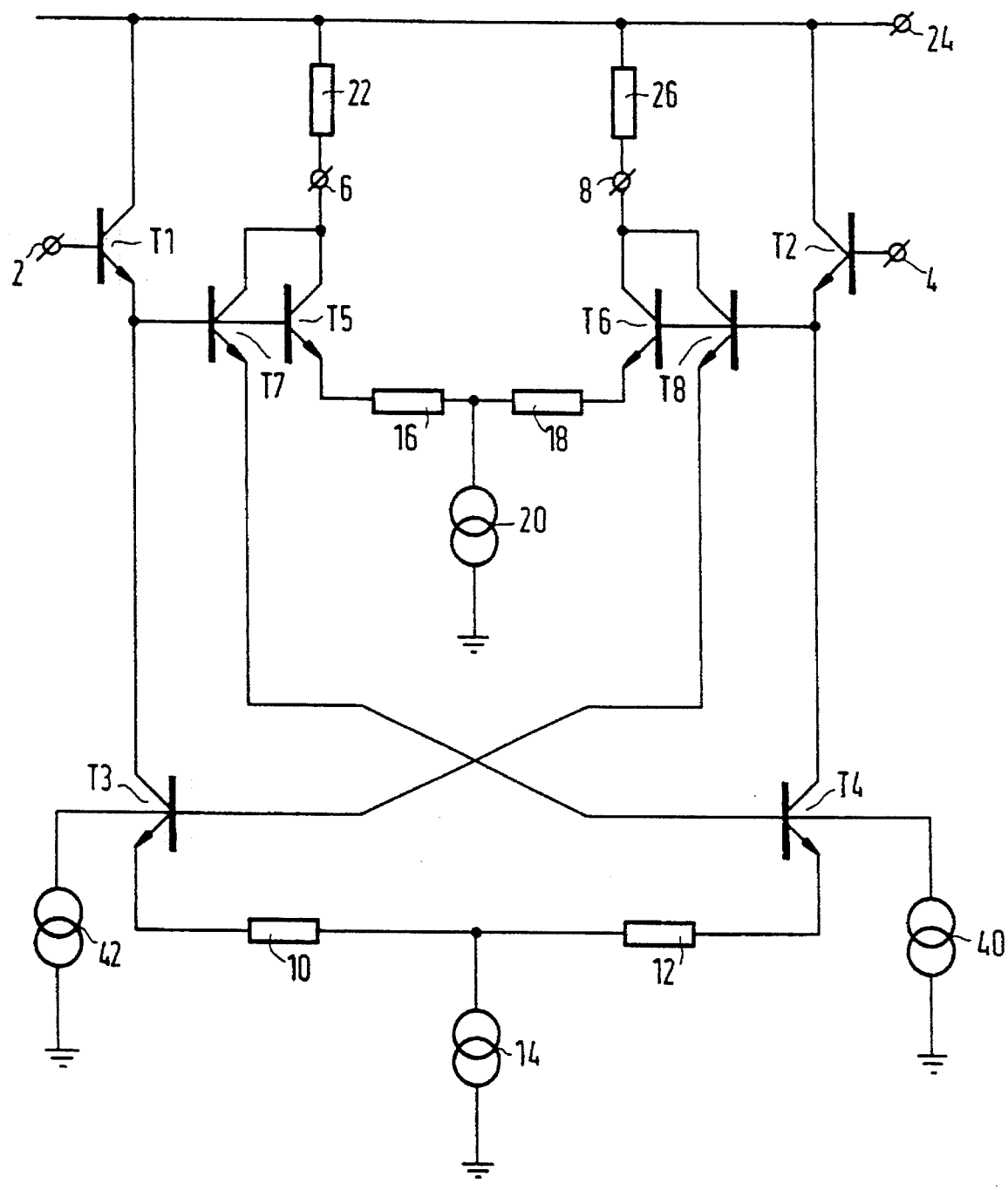
FIG. 3 shows an embodiment of a voltage-current converter in accordance with the invention comprising bipolar transistors.

FIG. 3 shows the voltage-current converter of FIG. 1 but now the transistor T4 has its base connected to tile emitter of tile transistor T1 via the base-emitter junction of a seventh transistor T7 arranged as an emitter follower, and the transistor T3 has its base connected to the emitter of the transistor T2 via the base-emitter junction of an eighth transistor T8 arranged as an emitter follower. The emitters of the transistors T7 and T8 are supplied with current from current sources 40 and 42. In the case of large voltage excursions on the input terminals 2 and 4 one of the transistors T3 and T4 is bottomed and thus disturbs the linearity of the voltage-current conversion. The additional voltage drop across the base-emitter junctions of the transistors T7 and T8 raises the permissible input voltage excursion by one base-emitter voltage.

At high frequencies the linearity is limited in that the collector currents of the transistors T5 and T6 are no longer equal to the emitter currents of the transistors T5 and T6. As the emitter currents of the transistors T5 and T4 are equal and the emitter currents of the transistors T6 and T3 are equal a current which is a replica of the base current of the transistor T5 will flow through the transistor T7 and a current which is a replica of the base current of the transistor T6 will flow through the transistor T8. If the collector of the transistor T7 is now connected to the collector of the transistor T5 the collector current of the transistor T5 is replenished with the missing base current. The same is done with the collector of the transistor T8. As a result, the output current at the output terminals 6 and 8 is also linear at high frequencies. Moreover, this compensates for the non-linear capacitive base-collector currents of the transistors T5 and T6. This is achieved because replicas of these currents also flow through the transistors T7 and T8 and are subtracted from the output current. The residual non-linearity in the output currents is caused by the capacitive base-emitter currents of the transistors T7 and T8 themselves. Since the currents of the transistors T7 and T8 are only fractions of the currents through the transistors T3–T6 the dimensions of the transistors T7 and T8 can be comparatively small with a correspondingly small base-collector capacitance.

Figure 4:
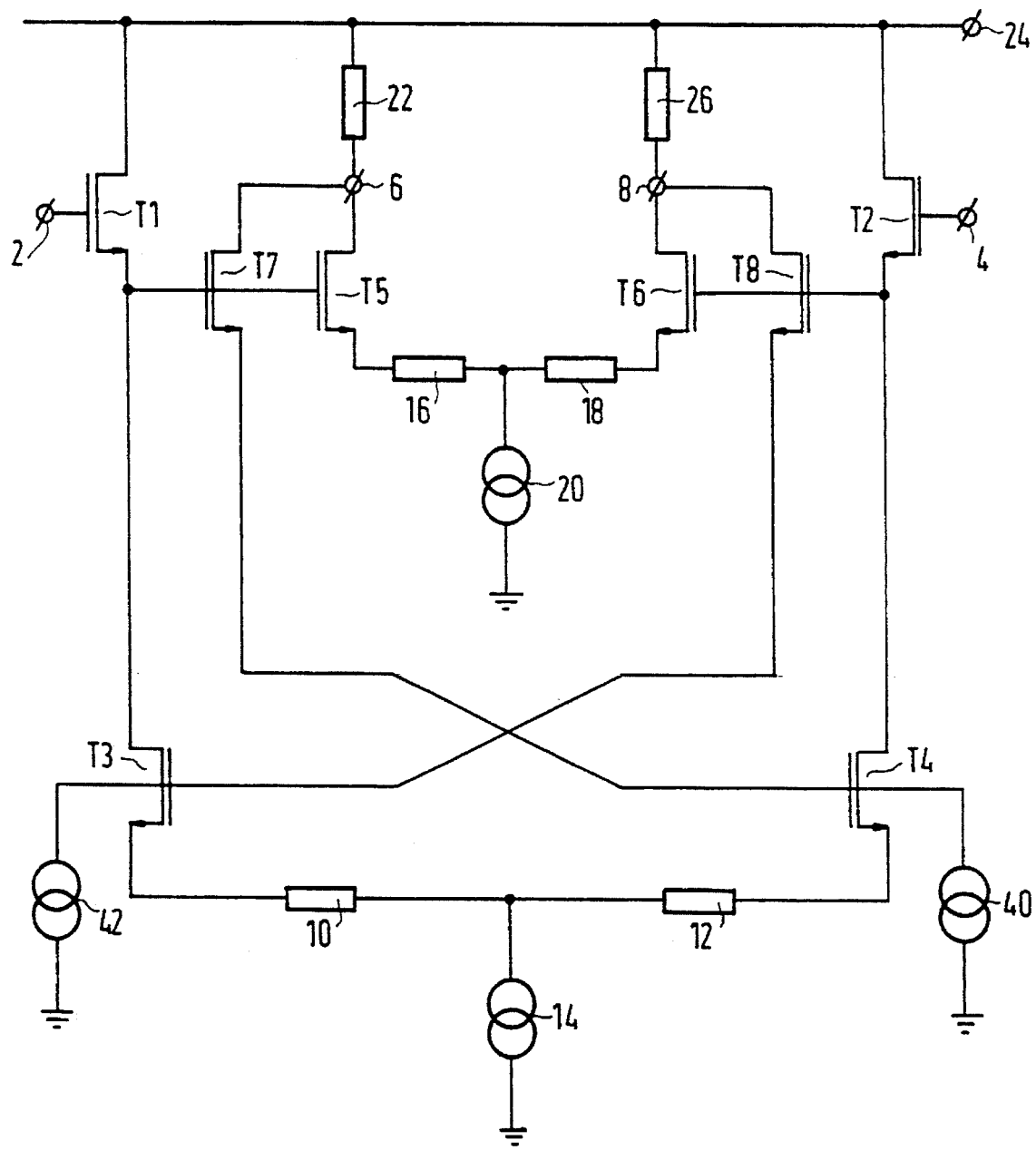
FIG. 4 shows an embodiment of a voltage-current converter in accordance with the invention comprising unipolar transistors.

If desired, all the embodiments described so far may be equipped with unipolar transistors, as is shown for the voltage-current converter in FIG. 4, which for the rest is identical to the voltage-current converter in FIG. 3. In the case of unipolar transistors the control electrode, the first main electrode and the second main electrode correspond to the gate, the source and the drain, respectively.

Obviously, the alternative circuit arrangement comprising two current sources an one resistor, as shown in FIG. 2, can also be used in the voltage-current converters in FIGS. 3 and 4. The NPN bipolar and N-channel unipolar transistors may be replaced by PNP transistors and P-channel transistors.

We claim:

1. A voltage-current converter for converting an input voltage into an output current, comprising:

a first (2) and a second (4) input terminal for receiving the input voltage; a first (6) and a second (8) output terminal for supplying the output current; a first (T1), a second (T2), a third (T3) and a fourth (T4) transistor, each having a control electrode, a first main electrode and a second main electrode, the control electrode of the first transistor (T1) being coupled to the first input terminal (2), the control electrode of the second transistor (T2) being coupled to the second input terminal (4), the first main electrode of the first transistor (T1) being coupled to the second main electrode of the third transistor (T3), the first main electrode of the second transistor (T2) being coupled to the second main electrode of the fourth transistor (T4), the control electrode of the third transistor (T3) being coupled to the first main electrode of the second transistor (T2), and the control electrode of the fourth transistor (T4) being coupled to the first main electrode of the first transistor (T1);

a first resistor (10, 12) connected between the first main electrode of the third transistor (T3) and the first main electrode of the fourth transistor (T4); and at least one first current source (14) coupled to the first main electrodes of the third transistor (T3) and the fourth transistor (T4), a fifth (T5) and a sixth (T6) transistor, each having a control electrode, a first main electrode and a second main electrode, the control electrode of the fifth transistor (TS) being coupled to the first main electrode of the first transistor (T1), the control electrode of the sixth transistor (TG) being coupled to the first main electrode of the second transistor (T2), the second main electrode of the fifth transistor (T5) being coupled to the first output terminal (6), and the second main electrode of the sixth transistor (T6) being coupled to the second output terminal (8);

a second resistor (16, 18) connected between the first main electrode of the fifth transistor (T5) and the first main electrode of the sixth transistor (T6); and at least one second current source (20) coupled between the first main electrodes of the fifth transistor (T5) and the sixth transistor (T6), characterised in that the voltage-current converter further comprises: a seventh (T7) and an eighth (T8) transistor, each having a control electrode, a first main electrode and a second main electrode, the control electrode of the seventh transistor (T7) being coupled to the first main electrode of the first transistor (T1), the control electrode of the eighth transistor (T8) being coupled to the the first main electrode of the second transistor (T2), the first main electrode of the seventh transistor (T7) being coupled to the control electrode of the fourth transistor (T4), and the first main electrode of the eighth transistor (T8) being coupled to the control electrode of the third transistor (T3), and in that the seventh transistor (T7) has its second main electrode coupled to the first output terminal (6) and the eighth transistor (T8) has its second main electrode coupled to the second output terminal (8).

* * * * *